(12) United States Patent
Rouphael

(10) Patent No.: US 6,304,620 B1
(45) Date of Patent: Oct. 16, 2001

(54) SIGN-CROSS PRODUCT AUTOMATIC FREQUENCY CONTROL LOOP

(75) Inventor: Antoine Rouphael, Indialantic, FL (US)

(73) Assignee: Philips Electronics North America Corproation, New York, NY (US)

(*) Notice: Subject to any disclaimer, the term of this patent is extended or adjusted under 35 U.S.C. 154(b) by 0 days.

(21) Appl. No.: 09/212,625

(22) Filed: Dec. 16, 1998

Related U.S. Application Data

(63) Continuation of application No. 09/045,354, filed on Mar. 20, 1998.

(51) Int. Cl.$^7$ .................................................. H04L 27/06
(52) U.S. Cl. ........................................... 375/344; 455/257
(58) Field of Search ........................... 375/344; 455/255, 455/256, 257, 258, 259, 260, 264

(56) References Cited

U.S. PATENT DOCUMENTS

| | | | |
|---|---|---|---|
| 4,672,631 | 6/1987 | Suzuki et al. | 375/14 |
| 5,003,621 | 3/1991 | Gailus | 455/209 |
| 5,400,363 | * 3/1995 | Waugh et al. | 375/324 |
| 5,612,976 | * 3/1997 | Granger-Jones | 375/322 |
| 5,940,450 | * 8/1999 | Koslov et al. | 375/344 |

FOREIGN PATENT DOCUMENTS

0335037A1    4/1989   (EP) .............................. H03C/1/00

OTHER PUBLICATIONS

"Digital Frequency Discriminator", Electronics Letters, Aug. 2, 1979, vol. 15, No. 16.

"Some Features of Signal Demodulation Resulting From The Practical Implementation of a Direct Conversion Radio Receiver", Philips Journal of Research, pp. 219–231, vol. 41, No. 3, 1986.

* cited by examiner

*Primary Examiner*—Chi Pham
*Assistant Examiner*—Phuong Phu
(74) *Attorney, Agent, or Firm*—John F. Vodopia

(57) ABSTRACT

A reduced-complexity automatic frequency control (AFC) loop to match the frequency of a receiver to that of a transmitter. A received input signal is multiplied with the sine and cosine signals of a voltage-controlled-oscillator, digitized and filtered, and the sign (the most significant bit) of the cosine function of the received input signal is sliced off by a sign slicer circuit to provide an input to two sign gates. The outputs of the two sign gates are added to produce an estimate of the frequency error, which is used to control the voltage-controlled-oscillator to match the received signal's frequency. The required number of multiplier circuits required to implement the AFC loop is reduced from prior art AFC loops by the use of the sign slicer circuit and the use of the sign gates.

30 Claims, 3 Drawing Sheets

| y | d | M |
|---|---|---|
| +p | 1 | P |
| +p | −1 | −P |
| −p | 1 | −P |
| −p | −1 | P |

SIGN-CROSS PRODUCT AUTOMATIC FREQUENCY CONTROL LOOP

This application is a continuation of application Ser. No. 09/045,354, filed Mar. 20, 1998.

BACKGROUND OF THE INVENTION

1. Field of the Invention

The present invention relates generally to an automatic frequency control (AFC) circuit used to match the frequency of a signal receiver to that of a signal transmitter, and more particularly to sign-cross product frequency control circuits.

2. Discussion of the Background Art

An automatic frequency control (AFC) frequency locked loop is used primarily to match the frequency of a signal receiver to that of a signal transmitter. In coherent demodulation, a phase locked loop (PLL) is typically used to estimate both the frequency and phase error. "Phase" is used to mean the constant modulation phase, which is assumed to be constant over a period of time much longer than the period of the carrier signal. A conventional PLL receiver circuit maintains its synchronization by comparing and adjusting its internal clock signal to received clock signals. In an analog PLL, the internal and received clock signals are supplied to a comparator, which produces a voltage output pulse proportional to the phase differences of the clock signals. Each output pulse is integrated to produce a voltage, which is applied to a voltage-controlled oscillator to produce a phase locked receiver clock signal. Preferably, the phase error is driven to a small value and the voltage-controlled oscillator's frequency is kept equal to the input frequency.

However, PLLs typically have a narrow pull-in range centered about the receiver clock frequency and therefore during acquisition, and in the presence of large frequency errors, the performance of the PLL is very poor. For reliable operation, conventional PLL circuits must employ acquisition-aid circuitry, which unfortunately can represent as much as half of the total circuitry required for clock recovery. This is costly in terms of implementing a circuit on IC chips, where production cost is proportional to chip area.

An AFC can be used to estimate the frequency as an aid to the PLL during acquisition, as discussed by H. Meyr and G. Ascheid in *Synchronization in Digital Communications,* Wiley: New York, N.Y., 1990. Several types of AFC circuits are available in various implementations of circuit performance and circuit complexity, but high performance cross-product AFC circuits are particularly suitable for telephone communication applications. Cross-product AFC circuits are discussed by F. Natali in "Noise Performance of Cross-Product AFC with Decision Feedback for DPSK signals," *IEEE Trans. Communications,* vol. 34, pp. 303–307, March 1986; by F. Gardner in "Properties of Frequency Difference Detectors," *IEEE Trans. Communications,* vol. 33, pp. 131–138, February 1985; and by F. Natali in "AFC Tracking Algorithms," *IEEE Trans. Communications,* vol. 32, pp. 935–947, August 1986.

One type of AFC circuit used primarily to match the frequency of a signal receiver to that of a signal transmitter in telephone communication applications is a differentiator AFC, where the unknown frequency offset is obtained through differentiation.

A major problem encountered by wireless communication cellular telephone systems is destructive interference in the received radio signal from multi-path radio signals that are reflected from terrestrial obstructions such as buildings and moving vehicles. This causes the received radio signal to appear as the sum of the direct line-of-sight fundamental signal plus the signal reflections with different amounts of attenuation and delay.

The RAKE concept for combining multi-path radio signals was first described and published in 1958, but RAKE receivers are more thoroughly discussed in *Digital Communications* by Proakis, McGraw-Hill, Inc., 1995. A RAKE receiver consists of a bank of correlators matched to a spreading code used to perform the transmitter's CDMA modulation of the information. With a good choice of spreading codes, each delay path can be independently demodulated by a separate branch circuit or "finger" of the RAKE receiver. After each "finger" demodulates a separate reflection of the transmitted signal, these properly processed signals become carriers of additional information which are constructively combined to increase the overall Signal-to-Noise Ratio (SNR) of the received radio signal.

A RAKE receiver is more suitable than a conventional receiver for receiving and processing reflected multi-path radio signals and thus RAKE receivers are commonly implemented in cellular telephone receivers, especially in US code division multiple access (CDMA) cellular telephone receivers. Multi-path signal reflections can result in different velocities of relative movement between the receiver and each reflective object providing a path for the radio signal reflection, and each reflected radio signal's frequency as seen by the receiver will be either increased or decreased by a Doppler shift. This physical phenomenon is manifested in everyday life by the change in tone of a vehicle's siren as it approaches and then leaves a listener. Therefore, the RAKE receiver should ideally also compensate for the Doppler shift on each reflection of the transmitted signal.

During the acquisition stage, the mismatch between the received signal frequency and the local oscillator typically can be up to 6 KHz. At this stage, only one dedicated AFC detector can be used to correct for the frequency mismatch. During steady state, all AFC detectors in the various RAKE fingers become active and attempt to track the various Doppler shift frequencies due to each multi-path reflection.

Sign-cross-product AFC circuits work well in RAKE receivers used for cellular telephone applications. During steady state, the relative speed between the mobile station and the base station (or several base stations during handoffs) causes different random frequency modulations due to Doppler shifts on the various multi-path signals. The Doppler shifts are positive or negative depending on whether the mobile station is moving toward or away from the base station. Furthermore, objects moving in the mobile station's vicinity cause a time-varying Doppler shift in the multi-path channel.

The application of the sign-cross-product AFC algorithm is illustrated by a mobile station moving at a constant velocity v. The apparent change in frequency, or Doppler shift, is given by $$f_d = \frac{v}{\lambda} \cos\theta \qquad (1)$$

where $\lambda$ is the free space wavelength of the radio signal and $\theta$ is the spatial angle between the direction of motion of the mobile station and the multi-path waves impinging on the antenna. As the mobile station moves towards the propagating multi-path wave, the Doppler shift is positive and the apparent frequency increases.

Conversely, as the mobile station moves away from the propagating multi-path wave, the Doppler shift is negative and the apparent frequency decreases.

After acquisition, the received signal is filtered and mixed to base-band (zero IF) by demodulating the carrier frequency from the received waves. This process, however, does not remove the Doppler frequency shift (or offset) from the received signal. The presence of a Doppler frequency offset in the signal path can significantly degrade the performance of the radio receiver. An algorithm such as the sign-cross-product AFC algorithm can be employed to remove the unwanted frequency offset.

There are several levels of complexity in differentiator AFC circuits for RAKE receiver applications. In a balanced discrete quadricorrelator AFC loop, henceforth referred to as an AFC loop, the unknown frequency offset is obtained through differentiation. Referring to FIG. 1, the optimal phase estimator 100 structure conventionally comprises multipliers 102 and 104, integrators 106 and 108 and an arctangent function 110. The received signal y(t) can be expressed as $$y(t) = A \sin[\overline{\omega}t + (\omega - \overline{\omega})t + \theta] + n(t) \qquad (2)$$

where $\overline{\omega}$ is the frequency of the local oscillator (not shown) and A is a time-varying gain due to the fading characteristics of the channel. Combining the $\omega - \overline{\omega}$ term with the unknown constant carrier phase $\theta$ into one unknown time variant phase $\theta(t)$, equation (2) can be rewritten as $$y(t) = A \sin[\overline{\omega}t + \theta(t)] + n(t) \qquad (3)$$

In the noise free case, the outputs of the integrators (or low-pass filters) 106 and 108 are given as $$y_c(t) = A \cos \theta(t) \qquad (4)$$

and $$y_s(t) = A \sin \theta(t) \qquad (5)$$

The integrators 106 and 108 used in the optimal phase estimator structure 100 can be implemented in circuits requiring relatively few transistors compared to the multipliers 102 and 104. The arctangent function can also be implemented in circuits requiring relatively few transistors compared to the multipliers 102 and 104. The multipliers 102 and 104, which are typically floating point multiplier circuits, require a very large number of transistors and a corresponding large area of a chip if implemented in an integrated circuit.

FIG. 2 depicts a prior art differentiator AFC circuit 200 constructed of multipliers 202 and 204, analog-to-digital converters 206 and 208, integrators 210 and 212, down-sampler circuits 214 and 216, delay circuits 218 and 220, multipliers 222 and 224, adder 226, amplifier 228, loop filter 230, track-and-hold sampler 232, digital-to-analog converter 234 and voltage-controlled-oscillator (VCO) 236.

The received signal y(t) is first input to the frequency discriminator 240. The multipliers 202 and 204 function as correlation detectors. The received signal is cross-correlated with $\sin(\overline{\omega}t)$ and $\cos(\overline{\omega}t)$ to give the respective outputs $\sin[(\omega - \overline{\omega})t]$ and $\cos[(\omega - \overline{\omega})t]$ for the noise free case. In the presence of noise, however, the sine and cosine terms are contaminated with an additive broadband noise term, which at −5 dB tends to dominate the original sinusoidal signals. The desired signals (sinusoids) are very close to the base-band when compared to the overall bandwidth of the noise.

To smooth out the noise and improve the SNR, the correlated signals are then processed through integrators 210 and 212 and down-sampler circuits 214 and 216. The resulting signals are thus decimated to a lower rate, and only the mean noise-attenuated sample is retained. The signals $y_c$ and $y_s$ are then passed through a differentiator circuit formed of two delays 218 and 220, two multipliers 222 and 224, and an adder 226, resulting in an estimate of the frequency error $f_e$. The frequency error signal $f_e$ is then passed through amplifier 228, loop filter 230, track-and-hold sampler 232 and digital-to-analog converter 234, to produce an output which is an estimate of the frequency offset that is then fed to the voltage-controlled-oscillator (VCO) 236. The VCO 236 output is fed back as an input either to the frequency discriminator 240 or to an intermediate frequency (IF) oscillator (not shown).

Prior art sign cross-product automatic frequency control circuits use at least two floating point multipliers 222 and 224 to implement a frequency discriminator. Floating point multiplier circuits have several disadvantages. Because of their complexity, floating point multiplier circuits require thousands of transistors, and consequentially require considerable integrated circuit (IC) chip area for implementation. The large IC area required for the multiplier increases power supply (battery) drain and heat dissipation. Also, floating point multiplications require numerous clock cycles and are generally slow to execute.

For these and other reasons, a frequency discriminator is needed that avoids use of multipliers in implementing the cross-product automatic frequency control loop.

SUMMARY OF THE INVENTION

The present invention provides a system and a method for using a cross-product automatic frequency control (AFC) loop to receive a signal. The invention substitutes the use of sign gates for the prior art use of multipliers, thus greatly simplifying the hardware and software implementation of the AFC frequency locked loop.

The received signal is first input to multipliers functioning as correlation detectors; that is, the received signal is cross-correlated with $\sin(\overline{\omega}t)$ and $\cos(\overline{\omega}t)$, where $\overline{\omega}$ is the angular frequency of a local oscillator in the receiver. The multipliers produce cross-correlated signal outputs $\sin[(\omega - \overline{\omega})t]$ and $\cos[\omega - \overline{\omega})t]$ respectively, which then go through analog-to-digital converters. To smooth out the noise and improve the Signal-to-Noise Ratio (SNR), the signals pass through respective integrators and down-sampler circuits. The signals then pass through an AFC loop comprised of a sign slicer, two sign gates, two delays, and an adder to provide an estimate of the frequency error.

The sign slicer retains the sign, consisting of the most significant bit (MSB), of the cosine signal. The I-path ("In-phase" path) and Q-path ("Quadrature" path) multipliers of the prior art are replaced by two sign gates. The inputs to each of the sign gates are the sine signal $y_s$ and the MSB of the cosine signal $y_c$. The sign gate outputs determine the sign of the resulting sine signal $y_s$; thus the sign gates function as sign multipliers. If the cosine signal $y_c$ is positive, then the sine signal $y_s$ passes unchanged. On the other hand, if the cosine signal $y_c$ is negative, then the resulting sine signal $y_s$ is shifted by 90° (i.e., multiplied by minus 1).

The outputs of the two sign gates are summed by an adder circuit. The output of the adder is an estimate of the frequency error, which passes through a down-sampler, a delay, a loop filter, a track-and-hold sampler and a digitalto-analog converter to a voltage-controlled-oscillator. The voltage-controlled-oscillator output provides sine and cosine signals for cross-correlation with the received signal y(t).

DETAILED DESCRIPTION OF THE INVENTION

Figure 3:
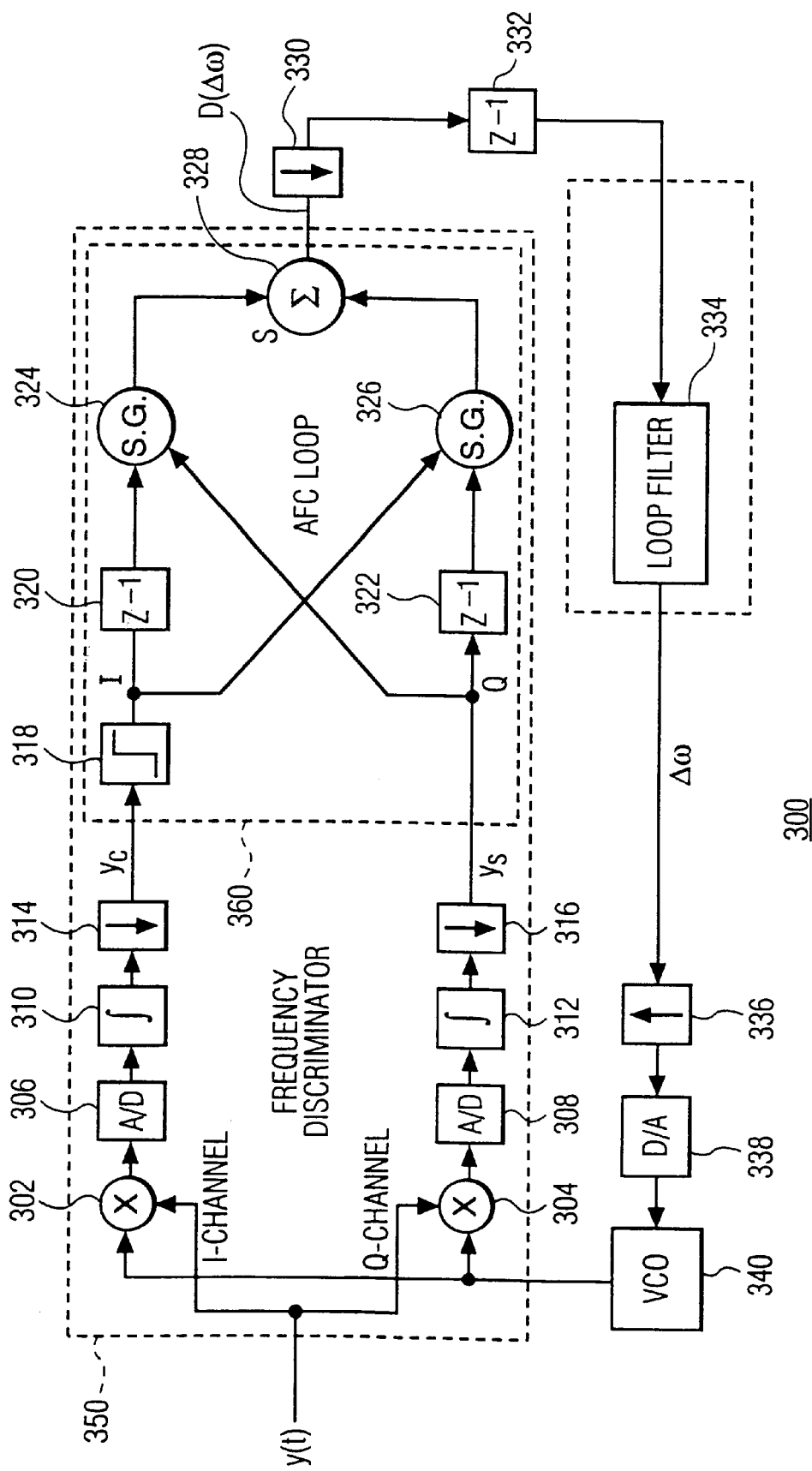
FIG. 3 is a circuit diagram of a sign-cross-product AFC loop configuration according to a preferred embodiment of the present invention.

FIG. 3 shows the invention in a preferred embodiment as an AFC circuit 300 constructed of multipliers 302 and 304, analog-to-digital converters 306 and 308, integrators 310 and 312, down-samplers 314 and 316, sign slicer 318, delays 320 and 322, sign gates 324 and 326, adder 328, down-sampler 330, delay 332, loop filter 334, track-and-hold sampler 336, digital-to-analog converter 338 and voltage-controlled-oscillator (VCO) 340.

Figure 1:
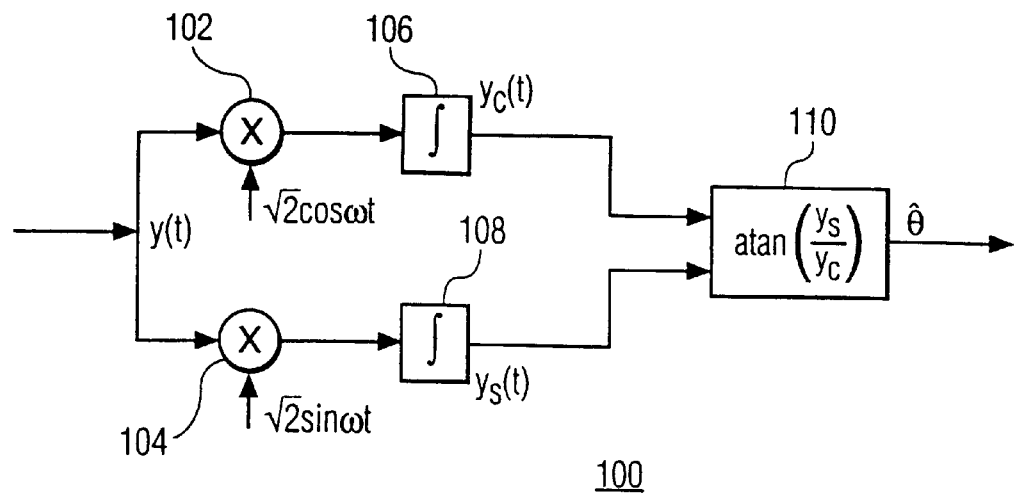
FIG. 1 is a circuit diagram of a prior art optimal phase estimator structure.
Figure 2:
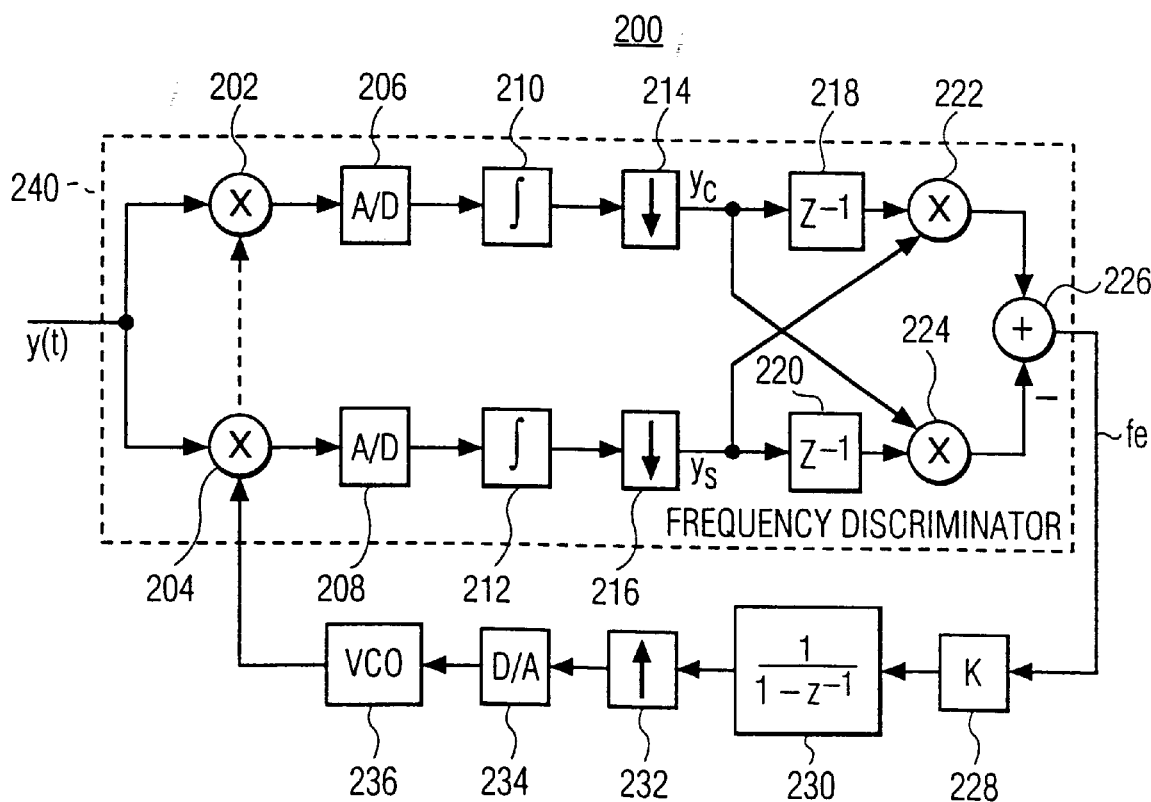
FIG. 2 shows a differentiator AFC employed in the prior art.

The floating point multipliers 222 and 224 of the FIG. 2 prior art AFC circuit 200 are replaced with sign gates 324 and 326 in improved AFC circuit 300. Utilization of the sign gates 324 and 326 greatly simplifies the implementation of AFC circuit 300, while retaining much of the accuracy (for small loop bandwidths) of the prior art AFC circuit 200.

The received signal y(t) is first input to multipliers 302 and 304, which function as correlation detectors; that is, the received signal y(t) is cross-correlated with sin($\bar{\omega}$t) and cos($\bar{\omega}$t) and the multiplier outputs become inputs to respective analog-to-digital converters 306 and 308. For the noise-free case, multipliers 302 and 304 produce cross-correlated signal outputs sin[($\omega-\bar{\omega}$)t] and cos[($\omega-\bar{\omega}$)t]. In the presence of noise, however, the sine and cosine terms are contaminated with an additive broadband noise term, which at −5 dB tends to dominate the original sinusoidal signals. The desired (sinusoids) signals are very close to the base-band when compared to the overall bandwidth of the noise. The output of the circuit is normally tapped from either of the signal outputs of analog-to-digital converters 306 or 308. To smooth out the noise and improve the Signal-to-Noise Ratio, the signal outputs from analog-to-digital converters 306 and 308 are then passed through integrators 310 and 312 and down-samplers 314 and 316. The resulting signals $y_c$ and $y_s$ are thereby decimated to a lower rate, and only the mean noise-attenuated sample is retained. The signals $y_c$ and $y_s$ are next passed through an AFC loop 360 comprised of a sign slicer 318, two delays 320 and 322, two sign gates 324 and 326, and an adder 328 resulting in an estimate of the frequency error, D($\Delta\omega$).

The sign slicer 318 retains the sign.(i.e., the most significant bit) of the signal $y_c$ output from down-sampler 314. The two prior art multipliers 222 and 224 are replaced by two sign gates 324 and 326. The inputs to sign gate 324 are the cosine signal MSB output of delay 320 and the output of down-sampler 316. The inputs to sign gate 326 are the sine signal output of the delay 322 and the output of the sign slicer 318. The outputs of sign gates 324 and 326 are signed sine signals. That is, the sign gates 324 and 326 function as sign multipliers. If the cosine signal $y_c$ is positive, then the sine signal $y_s$ is passed unchanged. On the other hand, if the cosine signal $y_c$ is negative, then the sine signal $y_s$ is shifted by 90° (i.e., multiplied by minus 1). The outputs of sign gates 324 and 326 are logically combined by adder 328, and the output of adder 328 is applied to the input of down-sampler 330. The decimated output of down-sampler 330 is applied to the input of delay 332. The time-delayed output of delay 332 is applied to the input of loop filter 334 and the loop filter 334 output is applied to the input of track-and-hold sampler 336. The accumulated output of track-and-hold sampler 336 is applied to the input of digital-to-analog converter 338 and the analog output of digital-to-analog converter 338 is applied to the input of voltage-controlled-oscillator (VCO) 340, to provide a local sine and cosine signal to cross-correlate with the received signal.

Figures 4, 5:
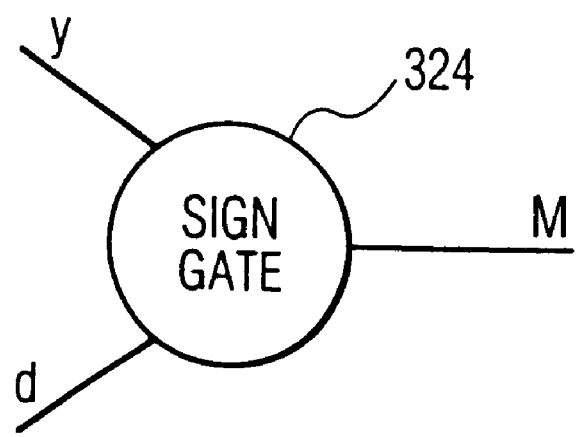
FIG. 4 is a circuit diagram of a sign gate symbol used in the circuit of FIG. 3.
FIG. 5 is a logic function table for the sign gate of FIG. 4.

FIG. 4 shows a sign gate 324 (sign gate 326 is the same) with input signals y and d and output signal M. The preferred sign gates 324 and 326 are implemented in software, although those skilled in the art will recognize that the gates can be realized equivalently using combinational logic. The input y signals for sign gates 324 and 326 are provided by the outputs of delay 320 and 322, respectively. The input d signals for sign gates 324 and 326 are provided by the outputs of down-sampler 316 and sign slicer 318, respectively.

FIG. 5 shows a logic table for the sign gates 324 and 326 of FIG. 4. If the input signal y is "+P" and input signal d is "1," then the output signal M is "+P," which means the input signal y is transmitted without inversion. When input signal y is "+P" and input signal d is "−1," then the output signal M is "−P," which means the input signal y is transmitted with inversion. When input signal y is "−P" and input signal d is "1," then the output signal M is "−P," which means the input signal y is transmitted without inversion. When input signal y is "−P" and input signal d is "−1," then the output signal M is "+P," which means the input signal y is transmitted with inversion.

For the proposed method, the sign-cross-product AFC loop 360 output can be expressed as $$D(\Delta\omega) \cong \frac{[y_s(n-1)sign\{y_c(n)\} - sign\{y_c(n-1)\}y_s(n)]}{\Delta T \sqrt{[y_s^2(n) + y_c^2(n)]}} \quad (6)$$

or more simply as $$D(\Delta\omega) \cong \quad (7)$$

$$\frac{1}{\Delta T}[\sin\{(n-1)(\Delta T\Delta\omega)\}sign\{y_c(n)\} - sign\{y_c(n-1)\}\sin\{n(\Delta T\Delta\omega)\}]$$

In the absence of noise, the error signal is equal to zero for more than one consecutive sample if and only if $\Delta\omega$ is equal to zero. In this case, the sign-cross-product AFC loop 360 is perfectly tracking the Doppler shift and effectively removing any unwanted frequency offset from the system. The ambiguity state (where the cosine term goes to zero) does not exist, since the signal output from the sign slicer circuit can only be in one of two states, namely −1 or +1. In the presence of noise, the error will approach zero once the frequency offset has been eliminated. The overall loop performance of this method, for a small loop bandwidth, is comparable to that of the FIG. 2 prior art loop. This has been verified by simulations using industry standard IS-95-type signals.

The exemplary embodiment described herein is for purposes of illustration and is not intended to be limiting. Therefore, those skilled in the art will recognize that other embodiments could be practiced without departing from the scope and spirit of the claims set forth below.

What is claimed is:

1. An automatic frequency control (AFC) circuit for matching the frequency of an input data signal, comprising:
    a sign slicer, coupled to receive a S/R-enhanced correlated cosine function of the input data signal, for producing an output signal that represents the sign value of the cosine function;
    first and second sign gates coupled to the sign slicer that are each configured to combine the sign slicer output signal slicer output signal with a correlated sine function of the input data signal to produce first and second sign gate output signals, respectively; and
    a signal adder coupled to receive the first and second sign gate output signals that is configured to generate at an output terminal an error signal used to generate said correlated sine and cosine functions.

2. The circuit of claim 1, further comprising:
    a first delay coupled between said sign slicer and said first sign gate for delaying said sign slicer output signal being input to said first sign gate; and
    a second delay coupled to delay said correlated sine function being input to said second sign gate.

3. The circuit of claim 2, further comprising
    a loop filter including
        an input terminal coupled to said output terminal of said signal adder and
        an output terminal for outputting a filtered error signal.

4. The circuit of claim 3, further comprising
    a voltage-controlled oscillator including:
        an input terminal coupled to the output terminal of said filter,
        a first output terminal for outputting a cosine signal, and
        a second output terminal for outputting a sine signal.

5. The circuit of claim 4, further comprising
    a converter that includes:
        an input terminal coupled to receive a digital form of said filtered error signal and
        an output terminal coupled to output an analog signal equivalent to said digital signal to the input of said voltage-controlled oscillator.

6. The circuit of claim 5, wherein said converter includes a digital-to-analog converter.

7. The circuit of claim 5, further comprising:
    a first correlator for multiplying said cosine signal with said input data signal to produce said correlated cosine function;
    a first analog-to-digital converter having
        an input terminal coupled for receiving said correlated cosine function and
        an output terminal for outputting a digitized correlated cosine function;
    a second correlator for multiplying said sine signal with said input data signal to produce said correlated sine function; and
    a second analog-to-digital converter having
        an input terminal coupled for receiving said correlated sine function and
        an output terminal for outputting a digitized correlated sine function.

8. The circuit of claim 7, further comprising:
    first filter means coupled between said first analog-to-digital converter and said sign slicer for receiving said digitized correlated cosine function and outputting a filtered correlated cosine function; and
    second filter means coupled between said second analog-to-digital converter and said second delay for receiving said digitized correlated sine function and outputting a filtered correlated sine function.

9. The circuit of claim 8 wherein said first filter means and said second filter means each comprise a respective integrate-and-down-sampler.

10. The circuit of claim 8, further comprising:
    a down-sampler for receiving said error signal and for outputting a decimated error signal; and
    a track-and-hold-circuit including an input terminal coupled to receive said filtered error signal and including an output terminal for generating an accumulated error signal.

11. The circuit of claim 10, further comprising:
    a delay including
        an input terminal coupled to receive said decimated error signal and
        an output terminal for outputting a delayed error signal.

12. The circuit of claim 11 wherein one of said digitized correlated cosine function and of said digitized correlated sine function is usable as a base band signal.

13. The circuit of claim 1, further comprising
    an integrate-and-down-sampler having
        an input terminal for receiving a digitized form of said correlated cosine function and
        an output terminal for outputting said correlated cosine function.

14. The circuit of claim 13, further comprising
    a delay including
        an input terminal coupled to receive a function of said error signal and
        an output terminal for outputting a delayed signal.

15. The circuit of claim 14, further comprising
    a loop filter including
        an input terminal coupled to said output terminal of said delay for receiving said delayed signal and
        an output terminal for outputting a filtered error signal.

16. The circuit of claim 15, further comprising:
    a digital-to-analog converter for receiving a digital signal and outputting an analog equivalent of said digital signal, including
        an input terminal coupled to receive said filtered error signal generated by said output said loop filter means and
        an output terminal to output an analog error signal;
    a voltage-controlled oscillator including
        an input terminal coupled to receive said analog error signal generated by said output terminal of said digital-to-analog converter,
        a first output terminal to output a cosine signal and
        a second output terminal to output a sine signal;
    a first multiplier for multiplying said cosine signal with said input data signal to produce said cosine function of said input data signal; and
    a second multiplier for multiplying said sine signal with said input data signal to produce a sine function of said input data signal.

17. The circuit of claim 1, further comprising
    an analog-to-digital processor with an input terminal for receiving said correlated sine function of said input data signal and an output terminal for outputting a digitized sine function that is an analog-to-digital conversion of said correlated sine function of said input data signal.

18. A cellular telephone receiver having an AFC circuit comprising:

first correlator means for generating a correlated cosine function of an input data signal;

second correlator means for generating a correlated sine function of said input data signal;

sign slicer means coupled to receive a signal-to-noise-ratio-enhanced correlated cosine function of the input data signal for producing a sign signal that represents a signed value of the correlated cosine function; and sign gate means coupled to said sign slicer means for receiving said sign signal and outputting on an output terminal an output signal used for generating an input signal coupled to at least one of said first and second correlator means.

19. A cellular telephone receiver having an AFC circuit comprising:

a first correlator that is configured to generate a correlated cosine function of an input data signal;

a second correlator that is configured to generate a correlated sine function of said input data signal;

a sign slicer coupled to receive a S/R-enhanced correlated cosine function of the input data signal that is configured to produce an output signal that represents a signed value of the correlated cosine function; and first and second sign gates each having
a first input terminal coupled to receive the sign slicer output signal and
an output terminal coupled to deliver an error signal to the first and second correlators.

20. The receiver of claim 19, further comprising
a voltage-controlled oscillator including
an input terminal coupled to receive an input signal proportional to said error signal,
a first output terminal to output a cosine signal and a second output terminal to output a sine signal;
wherein:
the first correlator includes
a first multiplier to multiply said cosine signal with said input data signal to produce said correlated cosine function of said input data signal; and
the second correlator includes
a second multiplier to multiply said sine signal with said input data signal to produce said correlated sine function of said input data signal.

21. A cellular telephone receiver having an AFC circuit comprising:

a first correlator that is configured to generate a correlated cosine function of an input data signal;

a second correlator that is configured to generate a correlated sine function of said input data signal;

a sign slicer coupled to said first correlator that is configured to produce an output signal that represents a signed value of the correlated cosine function; and first and second sign gates each having
a first input terminal coupled to receive the sign slicer output signal and
an output terminal coupled to deliver an error signal to the first and second correlators;
wherein said first input terminal of said first sign gate receives said correlated sine function, and said first sign gate has a second input terminal which receives a time-delayed input of the most significant bit of said correlated cosine function of said input data signal, and the circuit further comprises:
a signal adder having
a first input terminal coupled to said output terminal of said first sign gate,
a second input terminal coupled to said output terminal of said second sign gate, and
an output terminal for producing said error signal.

22. The circuit of claim 21, further comprising
an analog-to-digital converter including
an input terminal for receiving said correlated cosine function of said input data signal and
an output terminal for outputting a digitized cosine function that is an analog-to-digital conversion of said correlated cosine function.

23. The circuit of claim 22, further comprising an intergrate-and-down-sampler including an input terminal for receiving said digitized cosine function and an output terminal for outputting said correlated cosine function of said input data signal.

24. The circuit of claim 22, further comprising:
a delay including
an input terminal coupled to receive a function of said error signal and
an output terminal for outputting a delayed signal; and
a loop filter including
an input terminal coupled to said output terminal of said delay for receiving said delayed signal and
an output terminal for outputting a filtered error signal.

25. The circuit of claim 22, further comprising:
a down-sampler for receiving said error signal and for outputting a decimated error signal;
a delay for receiving said decimated error signal and an output terminal for outputting a delayed error signal;
a loop filter including an input terminal coupled to said output terminal of said delay and including an output terminal, for generating a frequency error signal on said output terminal of said loop filter; and
a track-and-hold-sampler including an input terminal coupled to receive said frequency error signal and including an output terminal for generating an amplified frequency error signal.

26. A method for automatic frequency control of an input data signal comprising:

correlating the input data signal with a sinusoidal signal to produce a correlated sinusoidal function of the input data signal;

creating a digitized correlated sinusoidal function of said input data signal;

digitally processing the digitized correlated function to produce a signal-to-noise-ratio-enhanced digitized correlated sinusoidal function;

filtering the correlated sinusoidal function to generate a sign signal representing the sign of the correlated sinusoidal function;

applying a sine function to the sign signal to generate a sign function output; and filtering the sign function output to generate said sinusoidal signal used in correlating the input data signal.

27. The method of operating an automatic frequency control (AFC) receiver of claim 26, further comprising integrating and decimating S/R enhanced said digitized correlated sinusoidal function and producing a decimated, digitized correlated sinusoidal function of said input data signal.

28. The method of operating an automatic frequency control (AFC) receiver of claim 26, further comprising combining the outputs of two sign gates to produce an error signal;

delaying said error signal to produce a delayed error signal; and filtering said delayed error signal through a loop filter to produce a loop filter output signal.

29. The method of operating an automatic frequency control (AFC) receiver of claim 28, further comprising applying an input signal proportional to said loop filter output signal to a voltage-controlled oscillator to produce a signal with a cosine component and a sine component; and wherein correlating the input signal includes multiplying said cosine component with said input data signal to produce said correlated sinusoidal function of said input data signal; and multiplying said sine component with said input data signal to produce said sine function.

30. A method for using a telephone receiver for receiving an input data signal, comprising:

slicing out the most significant bit of a digitized cosine component of said input data signal and outputting the most significant bit;

producing a first signed output signal based on a time-delayed digitized sine component of said input data signal and said most significant bit;

producing a second signed output signal based on a digitized sine component of the input data signal and a time-delayed input of said most significant bit adding the first signed output signal and the second signed output signal to produce a frequency error signal;

delaying the frequency error signal to produce a delayed error signal;

filtering said delayed error signal through a loop filter to produce a filtered delayed signal;

converting said filtered delayed signal through a digital-to-analog converter to produce a digitized delayed signal;

producing a signal having a cosine component and a sine component based on said digitized delay signal;

multiplying said cosine component with said input data signal to produce a cosine component of said input data signal;

multiplying said sine component with said input data signal to produce a sine component of said input data signal;

converting said cosine component into a digital cosine component of said input data signal;

converting said sine component of said input data signal into a digital sine component of said input data signal;

intergrating and decimating said digital cosine component and thereby producing said digitized cosine component of said input data signal; and intergrating and decimating said digital sine component and thereby producing said digitzed sine component of said input data signal.

* * * * *